US011718912B2

United States Patent
White et al.

(10) Patent No.: US 11,718,912 B2
(45) Date of Patent: Aug. 8, 2023

(54) METHODS AND APPARATUS FOR CALIBRATING CONCENTRATION SENSORS FOR PRECURSOR DELIVERY

(71) Applicant: APPLIED MATERIALS, INC., Santa Clara, CA (US)

(72) Inventors: Sarah L. White, Santa Clara, CA (US); Elaina Noelle Babayan, Sunnyvale, CA (US); Weize Hu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 49 days.

(21) Appl. No.: 16/932,107

(22) Filed: Jul. 17, 2020

(65) Prior Publication Data

US 2021/0032751 A1 Feb. 4, 2021

Related U.S. Application Data

(60) Provisional application No. 62/880,623, filed on Jul. 30, 2019.

(51) Int. Cl.
*C23C 16/455* (2006.01)
(52) U.S. Cl.
CPC .. *C23C 16/45557* (2013.01); *C23C 16/45544* (2013.01); *C23C 16/45561* (2013.01)
(58) Field of Classification Search
CPC .......... C23C 16/4481; C23C 16/45544; C23C 16/45557; C23C 16/45561
See application file for complete search history.

(56) References Cited

U.S. PATENT DOCUMENTS

| 7,735,452 B2 | 6/2010 | Spartz | |
|---|---|---|---|
| 2003/0138242 A1* | 7/2003 | Gelernt | C23C 16/52 392/394 |
| 2005/0120805 A1* | 6/2005 | Lane | C23C 16/45557 73/861 |
| 2006/0008328 A1 | 1/2006 | Morgan et al. | |
| 2006/0060139 A1 | 3/2006 | Meneghini et al. | |
| 2006/0115589 A1* | 6/2006 | Vukovic | C23C 16/4481 118/726 |
| 2008/0035202 A1 | 2/2008 | Lee et al. | |
| 2008/0078504 A1 | 4/2008 | Vukovic | |
| 2008/0078514 A1 | 4/2008 | Weerawarna et al. | |
| 2010/0084544 A1 | 4/2010 | Tallavarjula et al. | |

(Continued)

FOREIGN PATENT DOCUMENTS

| EP | 0370311 B1 | 8/1994 |
|---|---|---|
| JP | H02217474 A | 8/1990 |

OTHER PUBLICATIONS

International Search Report for PCT/US2020/043281, dated Nov. 3, 2020.

*Primary Examiner* — Joseph A Miller, Jr.
(74) *Attorney, Agent, or Firm* — Moser Taboada (57) ABSTRACT

Methods and apparatus for controlling precursor flow are provided. In embodiments, the methods and apparatus apparatus for controlling precursor flow to a deposition chamber, includes: an ampoule to output a precursor; a sensor assembly communicatively coupled to the ampoule; and a control system, wherein the control system is configured to calibrate the sensor assembly during flow of a precursor or a chemical standard through the sensor assembly.

12 Claims, 6 Drawing Sheets

(56) References Cited

U.S. PATENT DOCUMENTS

| | | |
|---|---|---|
| 2011/0174219 A1 | 7/2011 | Meneghini |
| 2014/0083159 A1 | 3/2014 | Nagai |
| 2016/0052651 A1 | 2/2016 | Nguyen et al. |
| 2017/0167027 A1 | 6/2017 | Liu et al. |
| 2019/0017131 A1 | 1/2019 | Khan et al. |
| 2019/0032207 A1 | 1/2019 | Woelk et al. |
| 2019/0119813 A1 | 4/2019 | Khan et al. |
| 2019/0203358 A1 | 7/2019 | Babayan et al. |
| 2019/0226937 A1 | 7/2019 | Glime, III |
| 2019/0264324 A1* | 8/2019 | Shugrue ............ C23C 16/45536 |

* cited by examiner

METHODS AND APPARATUS FOR CALIBRATING CONCENTRATION SENSORS FOR PRECURSOR DELIVERY

CROSS-REFERENCE TO RELATED APPLICATIONS

This application claims benefit of U.S. provisional patent application Ser. No. 62/880,623, filed Jul. 30, 2019 which is herein incorporated by reference in its entirety.

FIELD

Embodiments of the present disclosure generally relate to a methods and apparatus for calibrating concentration sensors for precursor delivery in a semiconductor deposition system and to control precursors in chemical deposition processes. More specifically, methods and apparatus for on-tool calibration verification and recalibration for concentration sensors for precursory delivery to a semiconductor deposition chamber are provided.

BACKGROUND

Semiconductor device fabrication includes chemical deposition processes to form thin layers with precise thickness control, including over three dimensional structures. Such chemical deposition processes include chemical vapor deposition (CVD) and atomic layer deposition (ALD), among other processes.

Such chemical deposition processes may involve delivering precursors from a solid source, gas source, or liquid source, such as an ampoule. For example, the precursor may be delivered from an ampoule to a process chamber, where the precursor reacts to form a layer or sub-layer on a substrate. The inventors have observed the amount of precursor being delivered may not be properly characterized as, overtime, concentration sensors become inaccurate and drift due to, among other things, deposition of precursor within the sensor, leading to drift in the raw or calibrated concentration sensor readings. Inaccurate or uncalibrated concentration sensors or delay in detecting or compensating for sensor drift problematically lead to variability in delivery of precursor substrate-to-substrate resulting in variability in the uniformity and repeatability of deposited films.

The inventors have also observed that problematic variation may occur between two or more sensor assemblies in different apparatuses. Consistent calibration is needed amongst a plurality of systems in order to maintain robust and uniform deposition on two or more deposition systems.

Therefore, the inventors have provided improved embodiments of calibrating concentration sensor assemblies for precursor delivery and controlling precursors in chemical deposition processes.

SUMMARY

Methods and apparatus for controlling precursor flow to a deposition chamber are provided herein. In some embodiments, a method of controlling precursor flow to a deposition chamber, includes: flowing a precursor or chemical standard through a sensor assembly and a gas delivery system configured to flow precursor into a deposition chamber; and calibrating the sensor assembly based on a flow of precursor or chemical standard through the sensor assembly.

In some embodiments, an apparatus for controlling precursor flow to a deposition chamber, includes: an ampoule to output a precursor; a sensor assembly communicatively coupled to the ampoule; and a control system, wherein the control system is configured to calibrate the sensor assembly during flow of the precursor or a chemical standard through the sensor assembly.

In some embodiments, a non-transitory computer readable storage medium is provided having stored instructions thereon that, when executed by a processor, cause a method to be performed, the method including: flowing a precursor or chemical standard through a sensor assembly and a gas delivery system configured to flow precursor into a deposition chamber; and calibrating the sensor assembly based on a flow of precursor or chemical standard through the sensor assembly.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In embodiments, the present disclosure relates to methods end apparatuses for controlling precursor flow to a deposition chamber, including: an ampoule to output a precursor; a sensor assembly communicatively coupled to the ampoule; and a control system, wherein the control system is configured to calibrate the sensor assembly during or by way of flow of a precursor or a chemical standard through the sensor assembly. In embodiments, methods and apparatuses are configured to measure initial accuracy and drift in accuracy over time of a concentration sensor and consequently decouple drift in sensor accuracy from real drift in chemical precursor delivery in a semiconductor processing tool. In embodiments, periodic recalibration of a concentration sensor apparatus prevents drift in sensor accuracy. Furthermore, in some embodiments, a method to compensate for drift in the accuracy of a concentration sensor is provided, allowing for the accurate control of chemical precursor delivery during semiconductor processing and/or an extension of concentration sensor lifetime between preventative maintenance cycles. In embodiments, the present disclosure includes methods and apparatuses configured to include the use of a chemical standard against which to measure concentration sensor accuracy.

The embodiments described herein provide novel processing and control of precursors in chemical deposition processes, such as atomic layer deposition (ALD) processes. ALD generally involves sequential exposure to two or more reactants to deposit a given monolayer of material. In embodiments, a chemical deposition process may be performed to deposit any appropriate material, including oxides, nitride, carbides, dielectrics, semiconductors, or metal. The chemical deposition process may involve control of precursor flow.

Figure 1A:
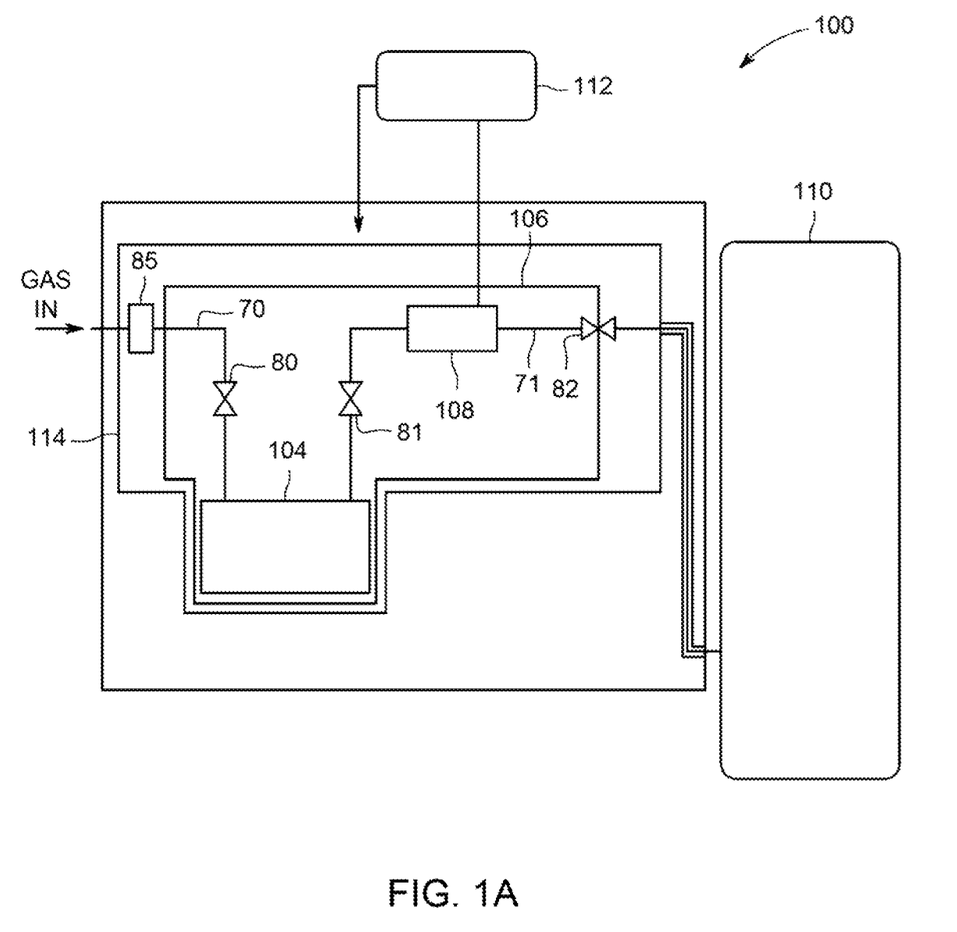
FIG. 1A depicts a system for chemical deposition, according to embodiments of the disclosure.

Referring now to FIG. 1A is a system 100 for chemical deposition in accordance with the present disclosure is shown. In embodiments, system 100 is configured for chemical deposition. In embodiments, system 100 is configured for use of at least one precursor, generally provided as a gaseous species to process chamber, referred to as deposition chamber 110. In embodiments, the system 100 may be employed to perform chemical vapor deposition (CVD) or atomic layer deposition (ALD). The embodiments are not limited in this context. The system 100 includes a source, such as ampoule 104, where the ampoule 104 may contain a solid, liquid or gas. The ampoule 104 may be maintained at an elevated temperature to generate a gaseous species, which species may be referred to herein as a precursor. The ampoule 104 may be coupled to a delivery system 114, configured to conduct at least one gaseous species, and in some cases, multiple gaseous species, to the deposition chamber 110, as in known CVD or ALD systems. For example, the delivery system 114 may include a plurality of gas lines such as first gas line 70 and second gas line 71, valves such as first valve 80, second valve 81, third valve 82, and flow controllers such as flow controller 85. At least a portion of the delivery system 114 may be contained within a hot chamber 106, where the hot chamber 106 is maintained in an accurately controlled isothermal environment, ensuring precursor(s) remain in the hot chamber 106 have the same temperature.

In embodiments, system 100 is an apparatus for controlling precursor flow to a deposition chamber, including: an ampoule 104 to output a precursor; a sensor assembly 108 communicatively coupled to the ampoule 104; and a control system, wherein the control system 112 is configured to calibrate the sensor assembly 108 during flow of a precursor or a chemical standard through the sensor assembly. In some embodiments, the sensor assembly 108 is disposed downstream of an ampoule 104 containing the precursor. In some embodiments, the sensor assembly 108 and one or more delivery lines such as first gas line 70 and second gas line 71, valves such as first valve 80, second valve 81, third valve 82, and flow controllers such as flow controller 85 are within a hot chamber 106. In some embodiments, the system 100 is an apparatus configured for flowing a known concentration of a precursor into a closed volume of a delivery system, wherein the closed volume comprises, or consists of an ampoule 104 including the precursor in fluid communication with the sensor assembly 108, wherein the closed volume is isothermic. In embodiments, the closed volume of a delivery system is the internal volume created by closing first valve 80 and closing third valve 82. In embodiments, the closed volume of a delivery system includes second valve 81 in an open position such that precursor material in a gaseous form may flow through the second valve 81. In embodiments, the closed volume may also comprise one or more additional chambers such as a reservoir including carrier gas chemistry.

Figure 1B:
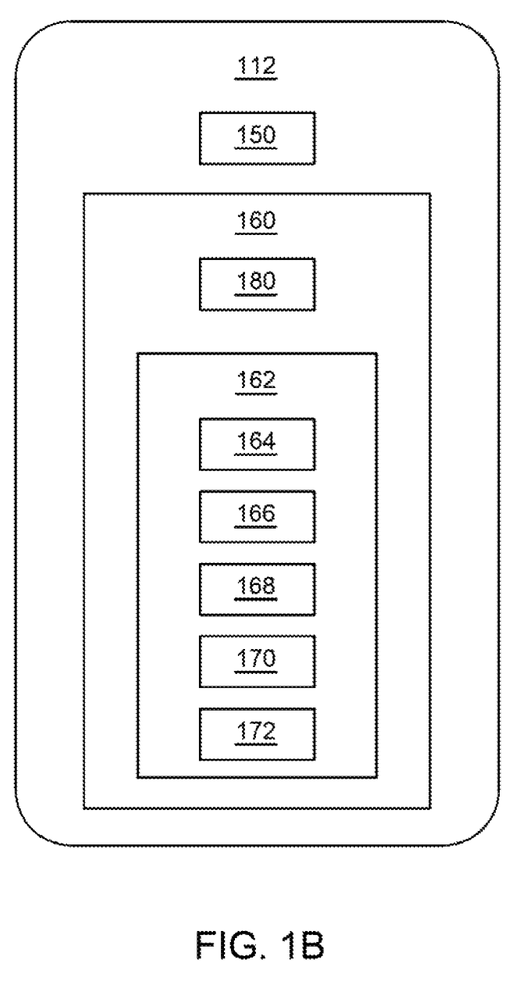
FIG. 1B shows one embodiment of a control system of the system of FIG. 1A.

In embodiments, system 100 may further include a sensor assembly 108, configured to monitor flow of at least one precursor between the ampoule 104 and deposition chamber 110. The sensor assembly 108 may be coupled to a control system 112, where the control system 112 may output information or signals to a user, as well as send control signals for controlling operating parameters of system 100, including temperature, precursor flow, and so forth. Details of an embodiment of the control system 112 are shown in FIG. 1B and discussed further below.

In embodiments, the control system 112 may be implemented in a combination of hardware and software. The control system 112 may comprise various hardware elements, software elements, or a combination of hardware/software. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), and programmable logic devices (PLD). Examples of hardware elements may also include digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, and functions. Examples of software elements may also include methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

As an example, the control system 112 may include various hardware outputs, which outputs may be embodied as signals for controlling other components of system 100, may be output on user interfaces, or output in other manner. In some examples, the hardware outputs may be employed as inputs by control system 112 to control components of system 100, as detailed below. In embodiments, hardware outputs include temperature, such as temperature of the ampoule 104, may be output, as well as gas pressure, precursor concentration, and a health monitor (reference signal).

In embodiments, outputs may be collected periodically, intermittently, and in synchronicity, or separately (in time) from one another. In embodiments, capabilities may be performed by the control system 112. Non-limiting examples of capabilities include: chamber flux ($\mu$mol/sec) for the purpose of modelling precursor flux delivered to a wafer; integrated chamber flux ($\mu$mol) for the purpose of total precursor flux over a wafer; ampoule integrated flux; end of life detection for the purpose of signaling ampoule change needed; fault detection for the purpose of detecting and classifying faults, and concentration detection for the purpose of fixing errors in concentration readings such as when comparing the concentration readings to a known precursor concentration or known chemical standard concentration.

Referring to FIG. 1B in embodiments, control system 112, may include a processor 150, such as a known type of microprocessor, dedicated semiconductor processor chip, general purpose semiconductor processor chip, or similar device. The control system 112 may further include a memory or memory unit 160, coupled to the processor 150, where the memory unit 160 contains a flux control routine 162. The flux control routine 162 may be operative on the processor 150 to control precursor flux or precursor flow in the system 100, as detailed below. In some embodiments, the flux control routine 162 may include one or more of an end-of-life processor 164, an excursion processor 166, and a clog-detection processor 168, a temperature control processor 170, and a concentration calibration processor 172.

In embodiments, memory unit 160 comprises an article of manufacture. In one embodiment, the memory unit 160 may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In some embodiments, the present disclosure includes a non-transitory computer readable storage medium having stored instructions thereon that, when executed by a processor, cause a method to be performed, the method comprising: flowing a precursor or chemical standard through a sensor assembly and a gas delivery system configured to flow precursor into a deposition chamber; and calibrating the sensor assembly based on a flow of precursor or chemical standard through the sensor assembly.

In some embodiments, memory unit 160 may include a system database 180, including parameters for operating the system 100. Exemplary parameters include, for example, a baseline concentration sensor assembly value for a preselected chemical standard or preselected precursor, a baseline ampoule side temperature and a baseline ampoule bottom temperature, where these parameters may be set as starting points for control operations to be performed. Other parameters subject to control may include flow rate as well as deposition time. Additional parameters, which parameters may also be stored in system database 180, may be employed to assign limits to ensure the temperature of a process stays within a safe range. Among these parameters are ampoule side temperature minimum, ampoule side temperature maximum, ampoule bottom temperature minimum, ampoule bottom temperature maximum, hot chamber temperature, and precursor degradation temperature.

Figure 2A:
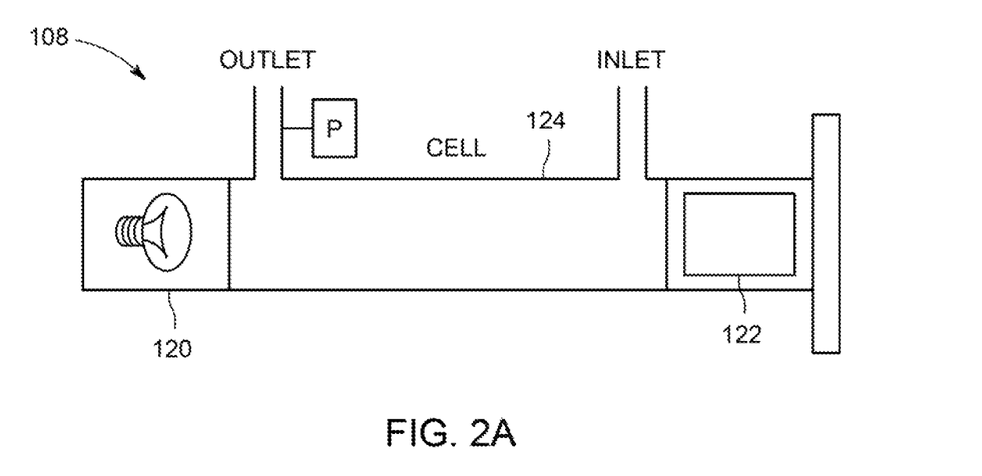
FIGS. 2A to 2B show operation of a sensor assembly according to embodiments of the disclosure.
Figure 2B:
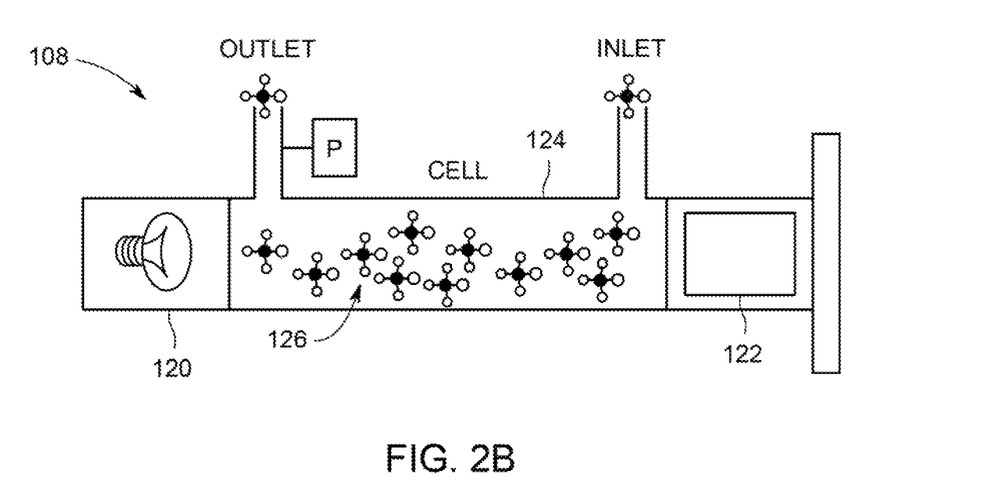

In embodiments, the sensor assembly 108 may be arranged with any suitable components for monitoring a precursor, including electromagnetic radiation, acoustic signals, and so forth. The embodiments are not limited in this context. The sensor assembly 108 may determine precursor flux or concentration by measuring a change in signal intensity of an appropriate signal transmitted through the sensor assembly 108. In embodiments, concentration may include, for example, precursor percent of total gas. Non-limiting example of concentrations that may be detected by sensor assembly 108 include 0.01 to 10,000 parts per million (ppm) of precursor in a gas. Turning to FIG. 2A and FIG. 2B, sensor assembly 108 may include a light source 120, such as an infrared, visible, or ultraviolet light source, and a detector 122, facing the light source 120. The detector 122 may be any detector, appropriate for the type of radiation source used for light source 120. The sensor assembly 108 may further include a chamber, shown as cell 124, where the cell 124 is arranged to receive a precursor 126 and to conduct the precursor 126, as the precursor 126 travels from the ampoule 104 to the deposition chamber 110. When the precursor 126 is absent from the cell 124, as in FIG. 2A, the detector 122 may register a signal, such as the background signal. The background signal may represent transmitted (detected) intensity as a function of wavelength of the radiation from light source 120. In some embodiments, the background signal may be featureless. When precursor 126 is present in the cell 124, the precursor may absorb radiation emitted by the light source 120, wherein the detector 122 registers a precursor signal. In embodiments, the precursor signal may exhibit a peak, while the precursor signal may include a multiplicity of features, including multiple peaks in some embodiments. In embodiments, the presence of the precursor in the cell 124 may reduce the overall intensity of detected radiation in precursor signal, as opposed to background signal. In embodiments, the recording of the background signal, as well as the monitoring of the precursor signal, over a plurality of instances, is employed to control operation of a deposition process.

In some embodiments, such as shown in FIG. 1A, the sensor assembly 108 may be calibrated or recalibrated by determining the concentration of chemical precursors in the cell 124 (FIG. 2B) under static conditions by creating a closed volume containing both the open chemical precursor ampoule 104 and sensor assembly 108 such as a concentration sensor assembly with cell 124. The temperature of the closed volume is controlled and measured precisely, and in embodiments, is isothermic. In embodiments, the concentration of the chemical precursors in the sensor assembly 108 with cell 124 is determined from the known vapor pressure of the chemical precursor at the temperature of the enclosed volume. In embodiments, light absorption by precursor 126 may be directly proportional to the partial pressure of the precursor 126 in the cell 124. As such, physical modelling may be employed to calculate precursor flux at multiple instances, based upon the repeated measurement of a precursor signal while accounting drift in sensor accuracy, facilitating better control of chemical deposition processes involving the precursor 126 with reduced or eliminated real drift in chemical precursor delivery. In addition to measuring precursor flux, the cell pressure, such as total pressure, in the cell 124 may also be measured.

Referring back to FIG. 1A, a known concentration of a chemical precursor may be flowed into the delivery system 114 through flow controller 85, first gas line 70 first valve 80, ampoule 104, second gas line 71, second valve 81, sensor assembly 108 third valve 82, and optionally one or more additional chambers such as a reservoir including carrier gas chemistry. In embodiments, the first valve 80 and third valve 82 are closed to create a closed volume including the open ampoule 104, and sensor assembly 108 such as a concentration sensor assembly, or between the first valve 80 and third valve 82. In embodiments, the closed volume includes a known concentration of chemical precursor under static conditions. In embodiments, the closed volume between the first valve 80 and third valve 82 are contained within a hot chamber 106, where the hot chamber 106 is maintained in an accurately controlled isothermal environment, ensuring precursor(s) in the hot chamber 106 have the same temperature. In embodiments, the concentration of the chemical precursors in the sensor cell can then be deduced from the known vapor pressure of the chemical precursor at the temperature of the enclosed volume. Based upon the determined concentration of chemical precursors, sensor assembly 108 may be calibrated, recalibrated, or have calibration verification on-tool. In embodiments, calibrating sensor assembly 108 compensates for sensor drift due to, among other things, precursor deposition within the sensor assembly 108 over the life of the sensor assembly 108. Sensor assembly 108 calibration on-tool facilitates better control of chemical deposition processes involving the precursor 126.

Figure 1C:
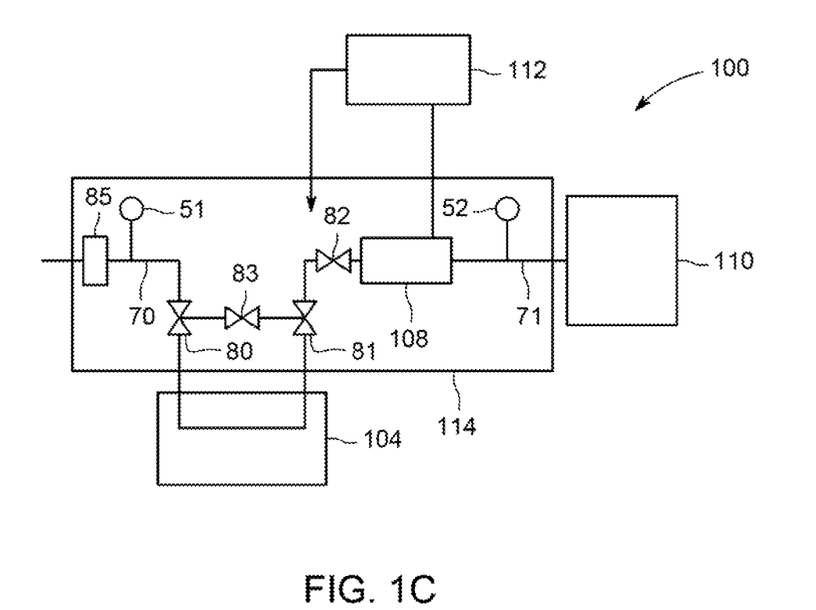
FIG. 1C shows another system for chemical deposition, according to embodiments of the disclosure.

Referring now to FIG. 1C, another system for chemical deposition, according to embodiments of the disclosure is shown. In embodiments, system 100 is configured for chemical deposition, according to embodiments of the disclosure. In embodiments, system 100 is configured for use of at least one precursor, generally provided as a gaseous species to process chamber such as deposition chamber 110. In embodiments, the system 100 may be employed to perform chemical vapor deposition (CVD) or atomic layer deposition (ALD). In embodiments, the system 100 includes a source, such as ampoule 104, where the ampoule 104 may contain a solid, liquid or gas. The ampoule 104 may be maintained at an elevated temperature to generate a gaseous species, which species may be referred to herein as a precursor. The ampoule 104 may be coupled to a delivery system, configured to conduct at least one gaseous species, and in some cases, multiple gaseous species, to the deposition chamber 110, as in known CVD or ALD systems. For example, the delivery system may include a plurality of gas lines such as first gas line 70 and second gas line 71, valves such as first valve 80, second valve 81, third valve 82, fourth valve 83, and flow controllers such as flow controller 85. In embodiments, system 100 a sensor assembly 108 as described above. The sensor assembly 108 may be coupled to a control system 112, where the control system 112 may output information or signals to a user, as well as send control signals for controlling operating parameters of system 100, including temperature, precursor flow, and so forth. Details of an embodiment of the control system 112 are described above. In embodiments, a first pressure sensor 51 is positioned on the first gas line 70 between the as flow controller 85 and first valve 80. In embodiments, a second pressure sensor 52 is positioned on the second gas line 71 downstream of sensor assembly 108 and upstream the deposition chamber 110. In embodiments, a fourth valve 83 is positioned between first valve 80 and second valve 81 to configure the delivery system to bypass ampoule 104 through a bypass path formed between first valve 80 and second valve 81 when desired by opening fourth valve 84. In embodiments, fourth valve may be closed to configure the delivery lines to form a though ampoule path, between first valve 80 and second valve 81.

In embodiments, a known concentration of chemical precursor under flow conditions may be provided to sensor assembly 108 by measuring the steady-state pressure change across the ampoule 104 when flowing through the ampoule 104 versus bypassing the ampoule 104. Other embodiments may include measuring the change of the rate in rise in pressure in the process chamber or a fixed volume to determine the change in flow. In some embodiments, the flow of precursor out of the ampoule 104 is determined. In embodiments, one or more pressure sensors such as first pressure sensor 51 or second pressure sensor 52 and a flow controller 85 are included to measure the pressure change. In embodiments, the precursor concentration can be estimated by: flowing a plurality (three or more) of different steady-state flows through the delivery lines, bypassing ampoule 104; measuring the average pressure downstream of ampoule 104 during a steady-state flow, for example, by measuring pressure with second pressure sensor 52; generating a functional mapping between measured flow or the change in flow between a bypass path and though ampoule path; modelling to estimate additional flow from precursor in ampoule 104. In embodiments the total flow is carrier flow plus precursor flow. In embodiments, concentration is calculated as the percentage of precursor flow of total flow. Based upon the determined concentration of chemical precursors, sensor assembly 108 may be calibrated, recalibrated, or have calibration verification on-tool. In embodiments, calibrating sensor assembly 108 compensates for sensor drift due to precursor deposition within the sensor assembly 108 over the life of the sensor assembly 108. Sensor assembly 108 calibration on-tool facilitates better control of chemical deposition processes involving the precursor 126.

In embodiments, system 100 includes an apparatus for controlling precursor flow to a deposition chamber, including: an ampoule 104 to output a precursor; a sensor assembly 108 communicatively coupled to the ampoule 104; and a control system 112, wherein the control system 112 is configured to calibrate the sensor assembly 108 during flow of the precursor or a chemical standard through the sensor assembly. In embodiments, the sensor assembly 108 is disposed downstream of an ampoule 104 containing the precursor. In embodiments, a first pressure sensor 51 is upstream the sensor assembly 108 and a second pressure sensor 52 is downstream the sensor assembly 108. In some embodiments, the system 100 further includes a delivery system 114 such as a gas delivery system including one or more delivery lines for a precursor path including a bypass path (between first valve 80 and second valve 81) upstream the sensor assembly 108.

Figure 1D:
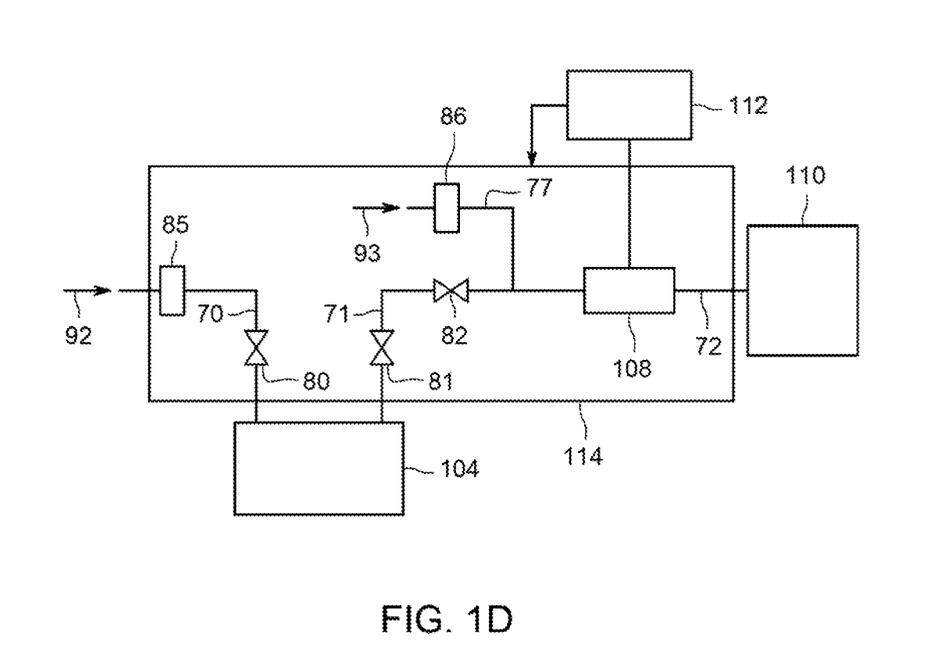
FIG. 1D shows another system for chemical deposition, according to embodiments of the disclosure.

Referring now to FIG. 1D, another system for chemical deposition, according to embodiments of the disclosure is shown. In embodiments, system 100 is configured for use of at least one precursor, generally provided as a gaseous species to process chamber, referred to as deposition chamber 110. In embodiments, the system 100 may be employed to perform chemical vapor deposition (CVD) or atomic layer deposition (ALD). In embodiments, the system 100 includes a source, such as ampoule 104, where the ampoule 104 may contain a solid, liquid or gas. The ampoule 104 may be maintained at an elevated temperature to generate a gaseous species, which species may be referred to herein as a precursor. The ampoule 104 may be coupled to a delivery system 114, configured to conduct at least one gaseous species, and in some cases, multiple gaseous species, to the deposition chamber 110, as in known CVD or ALD systems. For example, the delivery system 114 may include a plurality of gas lines such as first gas line 70, second gas line 71, third gas line 72, valves such as first valve 80, second valve 81, third valve 82, and flow controllers such as flow controller 85 and second flow controller 86 in communication with third gas line 72 upstream of sensor assembly 108. In embodiments, system 100 includes a sensor assembly 108 as described above. The sensor assembly 108 may be coupled to a control system 112, where the control system 112 may output information or signals to a user, as well as send control signals for controlling operating parameters of system 100, including temperature, precursor flow, and so forth. Details of an embodiment of the control system 112 are described above. In embodiments, a calibration gas including a chemical standard may enter third gas line 72 at arrow 93. In embodiments, a carrier gas may enter the first gas line 70 at arrow 92.

In embodiments, such as those disclosed in FIG. 1D, a known concentration of calibration gas including a chemical standard under flow conditions may enter into sensor assembly 108 via third gas line 72 where sensor readings will be obtained based on the chemical standard. In embodiments, a calibration gas including a chemical standard is used in place of a target chemical precursor gas. In embodiments, suitable calibration gas(es) for use in accordance with the present disclosure include a chemical standard such as a precursor gas species chemically similar to a target chemical precursor by having similar absorption spectra, and/or similar partial pressure dependence. In embodiments, the chemical standard is preselected, for example a chemical species or moiety having similar absorption spectra to a target precursor. In embodiments, the target precursor is the desired precursor for deposition. In embodiments, calibration gas and the chemical standard therein is gaseous under expected process conditions and introduced through second flow controller 86 such as a mass flow controller so a known and well-controlled concentration of calibration gas and chemical standard is introduced into sensor assembly 108.

In embodiments of FIG. 1D, the sensor assembly 108 may be calibrated upon installation into a precursor delivery system using a calibration gas. Since the calibration gas comprises a chemical standard spectrally similar to the precursor, the calibration gas can be used to correct for small errors in the sensor assembly 108, or to calibrate a raw sensor reading against a known concentration of calibration gas. In embodiments, correcting the calibration of sensor assembly 108 will be dependent on the sensor type and original sensor calibration method, including testing the sensor assembly 108 at a range of concentration, temperature, and pressure conditions and creating a functional mapping between known calibration gas concentration and sensor assembly 108 reading. In embodiments, sensor concentration reading is equal to f(calibration gas concentration, pressure, temperature). In some embodiments, periodically, a known concentration(s) of calibration gas including a chemical standard will be introduced into the sensor assembly 108 and a drift in the reading from an expected reading or an initial baseline reading will be measured. In embodiments, change in measured concentration from that of the original sensor assembly 108 sensor calibration will be from drift in the reading due to aging of optical components, deposition of chemical in the optical path within sensor assembly 108, or some other error.

In embodiments, an apparatus for controlling precursor flow to a deposition chamber, includes: an ampoule 104 to output a precursor; a sensor assembly 108 communicatively coupled to the ampoule 104; and a control system 112, wherein the control system 112 is configured to calibrate the sensor assembly during flow of the precursor or a chemical standard through the sensor assembly. In embodiments, the sensor assembly 108 is disposed downstream of an ampoule 104 containing the precursor. In embodiments, the sensor assembly 108 is disposed downstream of a delivery line 77 including a second flow controller 86 such as a mass flow controller and a chemical standard provided to the delivery line in a calibration gas at arrow 93. In some embodiments, system 100 is an apparatus configured for flowing a known concentration of a chemical standard into a sensor assembly, and measuring the chemical standard with the sensor assembly. In embodiments, the chemical standard is preselected.

Figure 1E:
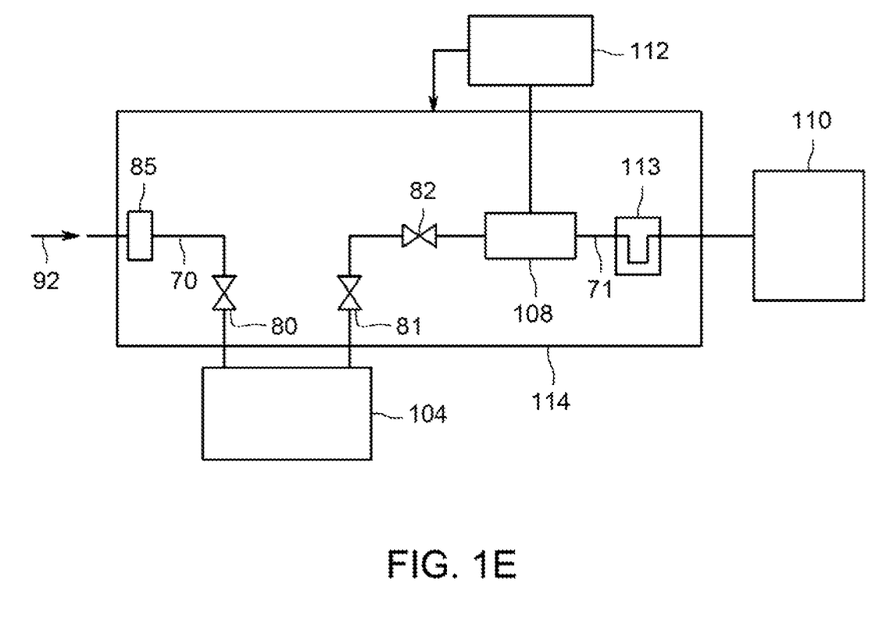
FIG. 1E shows another system for chemical deposition, according to embodiments of the disclosure.

Referring now to FIG. 1E, another system for chemical deposition, according to embodiments of the disclosure is shown. In embodiments, system 100 is configured for use of at least one precursor, generally provided as a gaseous species to process chamber, referred to as deposition chamber 110. In embodiments, the system 100 may be employed to perform chemical vapor deposition (CVD) or atomic layer deposition (ALD). In embodiments, the system 100 includes a source, such as ampoule 104, where the ampoule 104 may contain a solid, liquid or gas. The ampoule 104 may be maintained at an elevated temperature to generate a gaseous species, which species may be referred to herein as a precursor. The ampoule 104 may be coupled to a delivery system 114, configured to conduct at least one gaseous species, and in some cases, multiple gaseous species, to the deposition chamber 110, as in known CVD or ALD systems. For example, the delivery system may include a plurality of gas lines such as first gas line 70, second gas line 71, valves such as first valve 80, second valve 81, third valve 82, and flow controllers such as flow controller 85 in communication with first gas line 70 upstream of ampoule 104. In embodiments, system 100 includes a sensor assembly 108 as described above. The sensor assembly 108 may be coupled to a control system 112, where the control system 112 may output information or signals to a user, as well as send control signals for controlling operating parameters of system 100, including temperature, precursor flow, and so forth. Details of an embodiment of the control system 112 are described above. In embodiments, a carrier gas may enter the first gas line 70 at arrow 92. In embodiments, a trap 113 is positioned downstream of the sensor assembly 108.

Embodiments, of FIG. 1E may be configured for introducing an unknown concentration of precursor under flow conditions into the sensor assembly 108 and subsequently measuring the total flow of chemical precursor through the sensor assembly 108 by collecting all chemical precursors in trap 113 downstream of the sensor assembly 108 and measuring the total mass. In embodiments, methods include maintaining constant carrier gas flow over an extended period and measuring the average concentration sensor signal from sensor assembly 108. Expected total precursor flow can be determined from the total carrier flow through the sensor assembly 108 and the average concentration sensor assembly reading, and verified against the total mass of chemical precursor collected in trap 113. The total precursor flowed can also be determined from the total change in ampoule mass.

Figure 3:
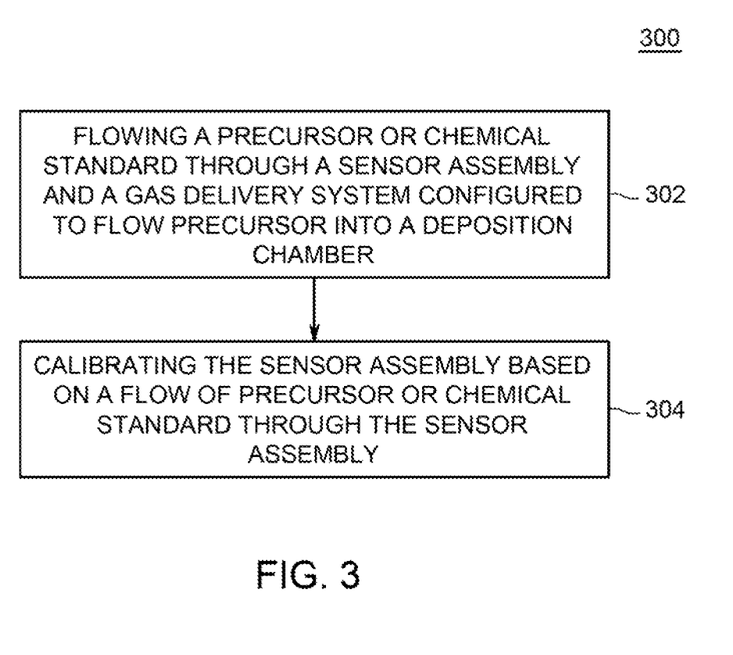
FIG. 3 presents an exemplary process flow according to embodiments of the disclosure.

Referring now to FIG. 3, a process flow according to embodiments of the disclosure is shown as process sequence 300 for a method of controlling precursor flow to a deposition chamber. At process sequence 302 the method includes flowing a precursor or chemical standard through a sensor assembly and a gas delivery system configured to flow precursor into a deposition chamber. At process sequence 304 the method includes calibrating the sensor assembly based on a flow of precursor or chemical standard through the sensor assembly. In some embodiments, the method includes a sensor assembly disposed downstream of an ampoule containing the precursor. In some embodiments, the method includes a sensor assembly is disposed downstream of a delivery line comprising a mass flow controller and a chemical standard. In some embodiments, the methods include a sensor assembly is disposed upstream of a trap. In some embodiments, the methods include the sensor assembly and one or more delivery lines are within a hot chamber. In some embodiments, the methods include a first pressure sensor positioned upstream the sensor assembly and a second pressure sensor is downstream the sensor assembly. In some embodiments, the methods include flowing a known concentration of a precursor into a closed volume of a delivery system, wherein the closed volume comprises an ampoule comprising the precursor in fluid communication with the sensor assembly, and wherein the closed volume is isothermic. In some embodiments, the methods include flowing a known concentration of a chemical standard into a sensor assembly, and measuring the chemical standard with the sensor assembly. In some embodiments, the methods include preselecting the chemical standard.

In some embodiments, the present disclosure relates to an apparatus, including: a processor; and a memory unit coupled to the processor, including a concentration control routine, the concentration control routine operative on the processor to monitor a precursor concentration, the concentration control routine including: a concentration drift calculation processor to: determine a precursor concentration drift value based upon a precursor or chemical standard flowed into a sensor assembly of a gas delivery system configured to deliver the precursor to a deposition chamber. In some embodiments, the concentration drift calculation processor detemines a precursor concentration value by: flowing a known concentration of a precursor into a closed volume of a delivery system, wherein the closed volume comprises an ampoule comprising the precursor in fluid communication with the sensor assembly, and wherein the closed volume is isothermic. In some embodiments, the precursor concentration value is determined from a known vapor pressure of the chemical standard at a temperature of the closed volume. In some embodiments, the concentration drift calculation processor determines a precursor concentration value as a percentage of a precursor flow of a total flow. In some embodiments, the concentration drift calculation processor determines a precursor concentration value as a percentage of a precursor flow of a total flow by: flowing a plurality of steady-state flows through a bypass valve and measuring average pressure downstream an ampoule; generating a mapping of a measured flow or a change in a flow between a bypass path and an ampoule path; and determining flow from a precursor in an ampoule. In some embodiments, the concentration drift calculation processor determines a precursor concentration value by: flowing a known concentration of a chemical standard into a sensor assembly, and measuring the chemical standard with the sensor assembly. In embodiments, the chemical standard is preselected. In some embodiments, the concentration drift calculation processor determines a precursor concentration value by: measuring a total mass of precursor passed through the gas delivery system.

While the foregoing is directed to embodiments of the present disclosure, other and further embodiments of the disclosure may be devised without departing from the basic scope thereof.

The invention claimed is:

1. A method of controlling an amount of a precursor flowing into a deposition chamber from an apparatus for controlling precursor flow, comprising:
    A. forming an enclosed volume having a known volume between an inlet and an outlet of the apparatus for controlling precursor flow, wherein the enclosed volume comprises an ampoule comprising the precursor and a flow-through cell of a sensor assembly, and wherein the enclosed volume is controlled to be isothermal at a known temperature sufficient to produce a portion of the precursor in a gaseous state within the enclosed volume;
    B. measuring a signal from the sensor assembly and performing a calibration of the apparatus for controlling precursor flow based on the measured signal from the sensor assembly, a known vapor pressure of the precursor at the known temperature, and the known volume; and
    C. flowing a carrier gas at an operative carrier gas flow rate through the inlet, through the ampoule, through the flow-through cell, and through the outlet into the deposition chamber, while measuring the signal from the sensor assembly, and determining an amount of the precursor flowing into the deposition chamber based on the operative carrier gas flow rate, the signal from the sensor assembly, and the calibration of the apparatus for controlling precursor flow, wherein the sensor assembly comprises an infrared light source, a visible light source, or an ultraviolet light source, and a corresponding detector.

2. The method of claim 1, wherein the ampoule further comprises a known amount of a chemical standard, and wherein the calibration of the apparatus for controlling precursor flow is further based on the measured signal from the sensor assembly correlated to an amount of the chemical standard present within the flow-through cell.

3. The method of claim 1, wherein the apparatus for controlling precursor flow is configured such that the carrier gas flows from the inlet through the flow-through cell of the sensor assembly and through the outlet bypassing the ampoule; and
    flowing the carrier gas through the inlet through the flow-through cell and through the outlet bypassing the ampoule and measuring a signal from the sensor assembly in the absence of the precursor to obtain a background signal from the sensor assembly, wherein the calibration of the apparatus for controlling precursor flow is further based on the background signal from the sensor assembly.

4. The method of claim 3, wherein the apparatus for controlling precursor flow further comprises a first pressure sensor disposed between the inlet and the ampoule, and a second pressure sensor disposed downstream from the flow-through cell of the sensor assembly; and
    flowing the carrier gas through the inlet through the flow-through cell and through the outlet bypassing the ampoule and measuring a first pressure using the first pressure sensor, and a second pressure using the second pressure sensor, under a plurality of different carrier gas flow rates while bypassing the ampoule and determining a background pressure difference between the first pressure and the second pressure for each of the plurality of different carrier gas flow rates; and
    flowing the carrier gas at an operative carrier gas flow rate through the inlet of the apparatus for controlling precursor flow, through the ampoule, through the flow-through cell, and through the outlet into the deposition chamber, while measuring the first pressure and the second pressure and determining an operative pressure difference at the operative carrier gas flow rate, wherein the calibration of the apparatus for controlling precursor flow is further based on each of the background pressure differences, and wherein the determining of the amount of the precursor flowing into the deposition chamber is based on the operative carrier gas flow rate, and the operative pressure difference.

5. The method of claim 2, wherein the chemical standard is selected based on having a chemical species or moiety having similar absorption spectra to the precursor.

6. The method of claim 1, wherein the apparatus for controlling precursor flow is periodically calibrated according to A. and B. to compensate for a drift in sensor accuracy.

7. The method of claim 3, wherein the background signal from the sensor assembly is periodically measured and utilized to recalibrate the apparatus for controlling precursor flow to compensate for a drift in sensor accuracy.

8. A method of controlling an amount of a precursor flowing into a deposition chamber from an apparatus for controlling precursor flow, comprising:
A. forming an enclosed volume having a known volume between an inlet and an outlet of the apparatus for controlling precursor flow, wherein the enclosed volume comprises an ampoule comprising the precursor and a flow-through cell of a sensor assembly, and wherein the enclosed volume is controlled to be isothermal at a known temperature sufficient to produce a portion of the precursor in a gaseous state within the enclosed volume;
B. measuring a signal from the sensor assembly and performing a calibration of the apparatus for controlling precursor flow based on the measured signal from the sensor assembly, a known vapor pressure of the precursor at the known temperature, and the known volume; and
C. flowing a carrier gas at an operative carrier gas flow rate through the inlet, through the ampoule, through the flow-through cell, and through the outlet into the deposition chamber, while measuring the signal from the sensor assembly, and determining an amount of the precursor flowing into the deposition chamber based on the operative carrier gas flow rate, the signal from the sensor assembly, and the calibration of the apparatus for controlling precursor flow, wherein the sensor assembly is disposed upstream of a trap, and wherein the calibration of the apparatus for controlling precursor flow is further based on collecting the precursor in the trap and measuring a total mass of the precursor present in the trap.

9. An apparatus for controlling precursor flow to a deposition chamber, comprising:
an ampoule to output a precursor;
a sensor assembly communicatively coupled to the ampoule; and
a control system, wherein the control system is configured to calibrate the sensor assembly during flow of the precursor or a chemical standard through the sensor assembly, wherein the control system is configured to control the apparatus to:
A. form an enclosed volume having a known volume between an inlet and an outlet of the apparatus for controlling precursor flow, wherein the enclosed volume comprises the ampoule comprising the precursor and a flow-through cell of the sensor assembly, and wherein the enclosed volume is controlled to be isothermal at a known temperature sufficient to produce a portion of the precursor in a gaseous state within the enclosed volume;
B. measure a signal from the sensor assembly and performing a calibration of the apparatus for controlling precursor flow based on the measured signal from the sensor assembly, a known vapor pressure of the precursor at the known temperature, and the known volume; and
C. flow a carrier gas at an operative carrier gas flow rate through the inlet, through the ampoule, through the flow-through cell, and through the outlet into the deposition chamber, while measuring the signal from the sensor assembly, and determining an amount of the precursor flowing into the deposition chamber based on the operative carrier gas flow rate, the signal from the sensor assembly, and the calibration of the apparatus for controlling precursor flow, wherein the sensor assembly comprises an infrared light source, a visible light source, or an ultraviolet light source, and a corresponding detector.

10. The apparatus of claim 9, wherein the sensor assembly is disposed upstream of a trap and wherein the calibration of the apparatus for controlling precursor flow is further based on collecting the precursor in the trap and measuring a total mass of the precursor present in the trap.

11. The apparatus of claim 9, wherein a first pressure sensor is disposed between the inlet and the ampoule and a second pressure sensor is disposed downstream from the flow-through cell of the sensor assembly, and
the control system is configured to flow the carrier gas through the inlet through the flow-through cell and through the outlet bypassing the ampoule and measuring a first pressure using the first pressure sensor, and a second pressure using the second pressure sensor, under a plurality of different carrier gas flow rates while bypassing the ampoule and determining a background pressure difference between the first pressure and the second pressure for each of the plurality of different carrier gas flow rates; and
flow the carrier gas at an operative carrier gas flow rate through the inlet of the apparatus for controlling precursor flow, through the ampoule, through the flow-through cell, and through the outlet into the deposition chamber, while measuring the first pressure and the second pressure and determining an operative pressure difference at the operative carrier gas flow rate, wherein the calibration of the apparatus for controlling precursor flow is further based on each of the background pressure differences, and
wherein the determining of the amount of the precursor flowing into the deposition chamber is based on the operative carrier gas flow rate, and the operative pressure difference.

12. The apparatus of claim 9, wherein the chemical standard is preselected.

* * * * *